US008003018B2

(12) United States Patent
Cho et al.

(10) Patent No.: US 8,003,018 B2
(45) Date of Patent: Aug. 23, 2011

(54) COMPOSITION FOR FABRICATION OF ELECTRODE, ELECTRODE FABRICATED USING THE SAME, PLASMA DISPLAY PANEL, AND ASSOCIATED METHODS

(75) Inventors: Jae Hwi Cho, Uiwang-si (KR); Kuninori Okamoto, Uiwang-si (KR); Yong Hyun Kim, Uiwang-si (KR); Hyun Don Kim, Uiwang-si (KR)

(73) Assignee: Cheil Industries, Inc., Gum-si, Kyeongsangbuk-do (KR)

( * ) Notice: Subject to any disclaimer, the term of this patent is extended or adjusted under 35 U.S.C. 154(b) by 281 days.

(21) Appl. No.: 12/285,658

(22) Filed: Oct. 10, 2008

(65) Prior Publication Data

US 2009/0108755 A1 Apr. 30, 2009

(30) Foreign Application Priority Data

Oct. 12, 2007 (KR) ........................ 10-2007-0103277

(51) Int. Cl.
*H01B 1/22* (2006.01)
*B05D 5/12* (2006.01)
*H01L 31/0224* (2006.01)

(52) U.S. Cl. ........................ 252/512; 427/96.1; 136/256

(58) Field of Classification Search .......... 252/512–514; 427/96.1, 123; 136/256
See application file for complete search history.

(56) References Cited

U.S. PATENT DOCUMENTS

| | | | | |
|---|---|---|---|---|
| 4,937,274 | A * | 6/1990 | Arima et al. | 523/220 |
| 5,972,564 | A * | 10/1999 | Kawana et al. | 430/281.1 |
| 7,488,434 | B2 * | 2/2009 | Kuo et al. | 252/512 |
| 2008/0081124 | A1 * | 4/2008 | Sano et al. | 427/508 |

FOREIGN PATENT DOCUMENTS

JP 2010-114075 * 5/2010

OTHER PUBLICATIONS

Astroshine Al flake product data sheet (No Pub Date, Info).*

* cited by examiner

*Primary Examiner* — Mark Kopec
(74) *Attorney, Agent, or Firm* — Lee & Morse, P.C.

(57) ABSTRACT

A composition for fabricating an electrode includes an organic binder and a conductive filler. About 3 to about 60 wt. % of the composition is the organic binder, about 5 to about 95 wt. % of the composition is the conductive filler, the conductive filler includes predominantly aluminum, the conductive filler has a flake shape, and the conductive filler has an average thickness of about 0.05 μm to about 0.75 μm.

17 Claims, 3 Drawing Sheets

FIG. 2

TABLE 1

| | Example 1 | Example 2 | Example 3 | Example 4 | Comparative Example 1 | Comparative Example 2 | Comparative Example 3 | Comparative Example 4 |
|---|---|---|---|---|---|---|---|---|
| Powder A (wt %) | - | - | - | - | - | 46.67 | - | 46.67 |
| Powder B (wt %) | - | - | - | - | - | - | 46.67 | - |
| Powder C (wt %) | 46.67 | - | 57.80 | 46.67 | - | - | - | - |
| Powder D (wt %) | - | 46.67 | - | - | - | - | - | - |
| Powder E (wt %) | - | - | - | - | 46.67 | - | - | - |
| Glass frits (wt %) | 11.43 | 11.43 | - | 11.43 | 11.43 | 11.43 | 11.43 | 11.43 |
| Organic binder (wt %) | 21.90 | 21.90 | 37.40 | 21.90 | 21.90 | 21.90 | 21.90 | 21.90 |
| Photo-initiator (wt %) | - | - | - | 1.5 | - | - | - | 1.5 |
| Photo-sensitive monomer (wt %) | - | - | - | 10 | - | - | - | 10 |
| Solvent (wt %) | 20 | 20 | 4.5 | 8.5 | 20 | 20 | 20 | 8.5 |
| Specific resistance at 560°C firing (μΩ.cm) | 125 | 100 | 62.6 | 130 | 400 | 330 | 324 | 350 |
| Wire resistance (Ω) | 0.21 | 0.19 | 0.17 | 0.22 | 1.60 | 0.50 | 0.54 | 0.55 |
| Film thickness (μm) | 29.7 | 30.2 | 18.4 | 29.5 | 12.5 | 33 | 30 | 32 |

Notes:

Powder A: aluminum flakes, average thickness = 1μm
Powder B: aluminum flakes, average thickness = 0.8μm
Powder C: aluminum flakes, average thickness = 0.49μm
Powder D: aluminum-silver alloy flakes, average thickness = 0.6μm
Powder E: spherical aluminum (atomized), average particle dia. = 5μm

FIG. 3

TABLE 2

| Number of firings at 560°C | Example 1 | | Comparative Example 1 | |
|---|---|---|---|---|
| | Resistance (Ω) | Resistance variation | Resistance (Ω) | Resistance variation |
| One | 0.28 | | 1.6 | |
| Two | 0.23 | -17.9% | 1.9 | 18.75% |
| Three | 0.23 | 0% | 2.2 | 37.5% |

COMPOSITION FOR FABRICATION OF ELECTRODE, ELECTRODE FABRICATED USING THE SAME, PLASMA DISPLAY PANEL, AND ASSOCIATED METHODS

BACKGROUND OF THE INVENTION

1. Field of the Invention

Embodiments relate to a composition for fabrication of an electrode, an electrode fabricated using the same, a plasma display panel, and associated methods.

2. Description of the Related Art

An element such as a resistor, a ceramic capacitor, a thermistor, a varistor, or an electrode for a plasma display panel (PDP), etc., may be patterned using a composition having a silver powder-containing conductive filler. The pattern may then be fired to fabricate, e.g., an electrode.

Using a composition that includes silver powder as a conductive filler results in increased production costs. Moreover, silver in an electrode pattern may exhibit material migration as a result of current flow in the electrode. This may reduce the reliability of the electrode. Further, in devices having a fine feature pitch, such material migration may generate a short circuit between adjacent electrodes.

There is a need for relatively low cost conductive filler materials capable of replacing silver powder. Aluminum is known to be conductive, but using aluminum as the conductive filler may be difficult because aluminum is readily oxidized when exposed to firing temperatures in an oxidative atmosphere. Furthermore, a firing process may be repeatedly performed when fabricating an electrode. Thus, the use of aluminum for the electrode may be expected to result in drastic deterioration in electrical conductivity of the electrode in the final product. Accordingly, there is a need for advances in the art that allow the use of aluminum-based conductive fillers.

SUMMARY OF THE INVENTION

Embodiments are therefore directed to a composition for fabrication of an electrode, an electrode fabricated using the same, a plasma display panel, and associated methods, which substantially overcome one or more of the problems due to the limitations and disadvantages of the related art.

It is therefore a feature of an embodiment to provide a composition having an aluminum-containing conductive filler that has a flake shape.

It is therefore another feature of an embodiment to provide a method of fabricating an electrode using a composition having an aluminum-containing conductive filler.

At least one of the above and other features and advantages may be realized by providing a composition for fabricating an electrode, the composition including an organic binder and a conductive filler. About 3 to about 60 wt. % of the composition may be the organic binder, about 5 to about 95 wt. % of the composition may be the conductive filler, the conductive filler may include predominantly aluminum, the conductive filler may have a flake shape, and the conductive filler may have an average thickness of about 0.05 μm to about 0.75 μm.

The composition may further include a solvent. About 1 to about 68 wt. % of the composition may be the solvent. The conductive filler may have an average thickness of less than 0.8 μm. The conductive filler may be prepared by processing a conductive powder to transform the powder to flakes. The conductive filler may include an alloy of aluminum with one or more of silver, copper, silicon, tin, chromium, or germanium.

The organic binder may include at least one copolymer of a first monomer and a second monomer, the first monomer may be a carboxyl group-containing monomer, and the second monomer may be an alkene-containing monomer. The carboxyl-group containing monomer may be a substituted or unsubstituted one of acrylic acid, methacrylic acid, or itaconic acid, and the alkene-containing monomer may be a substituted or unsubstituted one of acrylic acid ester, styrene, acrylamide, or acrylonitrile.

The composition may further include a glass frit. About 1 to about 30 wt. % of the composition may be the glass frit. The glass frit may have a glass transition temperature of about 300° C. to about 600° C. The composition may further include a photo-initiator. About 0.01 to about 10 wt. % of the composition may be the photo-initiator.

At least one of the above and other features and advantages may also be realized by providing a method of preparing a composition for fabricating an electrode, the method including providing an organic binder, and combining the organic binder and a conductive filler. About 3 to about 60 wt. % of the composition may be the organic binder, about 5 to about 95 wt. % of the composition may be the conductive filler, the conductive filler may include predominantly aluminum, the conductive filler may have a flake shape, and the conductive filler may have an average thickness of about 0.05 μm to about 0.75 μm.

The conductive filler may be prepared by processing a conductive powder to transform the powder to flakes. The method may further include providing a conductive powder, and processing the conductive powder using a mill so as to transform the powder to flakes.

At least one of the above and other features and advantages may also be realized by providing a method of fabricating an electrode, the method including providing a composition that includes an organic binder and a conductive filler, and forming the composition into an electrode pattern. About 3 to about 60 wt. % of the composition may be the organic binder, about 5 to about 95 wt. % of the composition may be the conductive filler, the conductive filler may include predominantly aluminum, the conductive filler may have a flake shape, and the conductive filler may have an average thickness of about 0.05 μm to about 0.75 μm.

The composition may be a dry film resist, and forming the composition into an electrode pattern may include patterning the dry film resist. Forming the composition into an electrode pattern may include application of the composition to a substrate, and the application of the composition to the substrate may include one or more of coating, screen printing, offset printing, or photolithography. The method may further include, after forming the composition into an electrode pattern, firing the electrode pattern at a temperature of about 450° C. to about 600° C.

At least one of the above and other features and advantages may also be realized by providing an electrode fabricated using a method according to an embodiment.

At least one of the above and other features and advantages may also be realized by providing a plasma display panel, including a front substrate and a rear substrate arranged opposite each other, transparent electrodes aligned in a first direction on the front substrate, bus electrodes on the transparent electrodes, and address electrodes aligned in a second direction on the rear substrate. The bus electrodes and/or the address electrodes may be fabricated using a method according to an embodiment.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 2 illustrates Table 1 setting forth components and physical properties of Examples 1-4 and Comparative Examples 1-4; and FIG. 3 illustrates Table 2 setting forth physical properties of electrodes prepared according to Example 1 and Comparative Example 1.

DETAILED DESCRIPTION OF THE INVENTION

Figure 1:
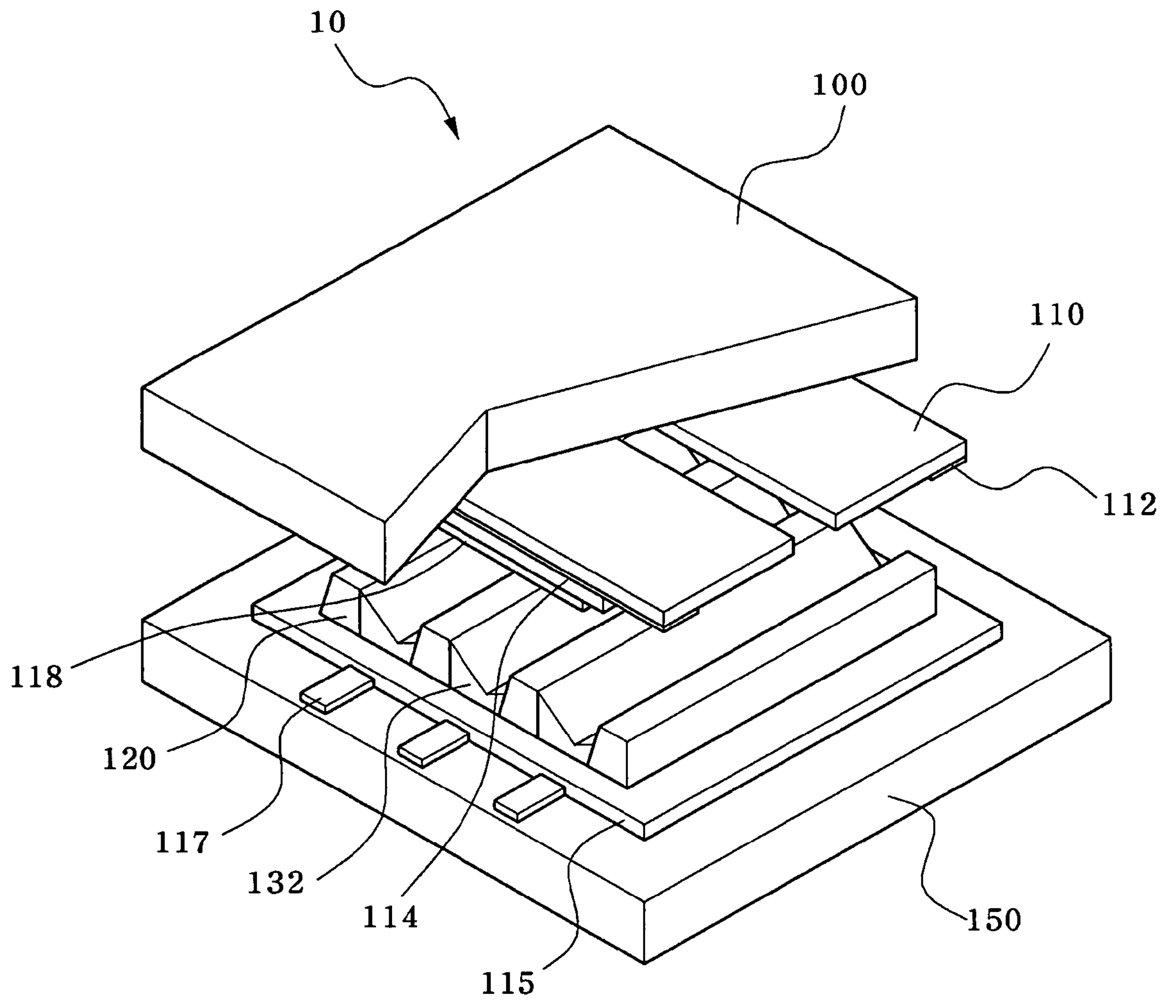
FIG. 1 illustrates an exploded perspective view of a plasma display panel fabricated using a composition according to an embodiment.

Korean Patent Application No. 10-2007-0103277, filed on Oct. 12, 2007, in the Korean Intellectual Property Office, and entitled: "Composition for Fabrication of Electrode Comprising Flake Type Aluminum and Electrode Fabricated Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "photo-polymerizable compound" may represent a single compound, e.g., ethylene glycol diacrylate, or multiple compounds in combination, e.g., ethylene glycol diacrylate mixed with novolac epoxy acrylate.

As used herein, molecular weights of polymeric materials are weight average molecular weights, unless otherwise indicated.

A composition for fabricating an electrode according to an embodiment may include an organic binder and a conductive filler. In an implementation, the composition may include the organic binder, the conductive filler, a solvent, a glass frit, and a photo-initiator.

The conductive filler may be predominantly aluminum, defined herein as a having a molar fraction of at least 50% aluminum. The conductive filler may have a flake shape, rather than a powder form. The flakes may have an average thickness of about 0.05 μm to about 0.75 μm. In an implementation, the average thickness of the flakes may be less than 0.8 μm.

The composition may be patterned and fired, e.g., at a temperature of about 600° C. or less. When fabricated using the conductive filler flakes described above, an electrode may show substantially little variation in resistance of the electrode, even when a re-firing process is conducted after an initial firing.

The conductive filler may include aluminum and/or aluminum alloys. The aluminum alloys may be prepared by alloying aluminum with one or more of, e.g., silver, copper, silicon, tin, chromium, or germanium.

An amount of the conductive filler in the composition may be about 5 to about 95 wt. %, where wt. % is relative to the total weight of the composition. If the amount is less than about 5 wt. %, the fabricated electrode may not exhibit a desired level of conductivity. If the amount exceeds about 95 wt. %, the electrode may exhibit inferior adhesive properties to a substrate and/or deteriorated printing properties.

The flakes of conductive filler preferably have an average thickness of about 0.05 μm to about 0.75 μm. Such a thickness may help ensure that the resultant electrode exhibits a desired resistance.

The organic binder may be added to the composition in order to assist mixing of the conductive filler with the glass frit, and to allow the composition to have a uniform viscosity. As a result, an electrode pattern suitable for withstanding a firing process may be obtained.

The organic binder may include copolymers. The copolymers may be obtained by copolymerization of a carboxyl group-containing monomer, such as acrylic acid, methacrylic acid, itaconic acid, etc., and another monomer having ethylene unsaturated double bonds, such as acrylic acid ester (i.e., methyl acrylate, ethyl acrylate, etc.), styrene, acrylamide, acrylonitrile, etc.

The amount of the organic binder in the composition may be about 3 to about 60 wt. %, preferably, about 5 to about 50 wt. %. If the amount of the organic binder is less than about 3 wt. %, a paste obtained from the composition may have too low a viscosity and/or show reduced adhesion after a printing or drying process. If the amount exceeds about 60 wt. %, the organic binder may not be sufficiently degraded during firing of an electrode, which may increase resistance of the resultant electrode.

The composition may also include a solvent. The amount of solvent may be dependent on specific applications thereof. Adjusting the amount of the solvent may easily control viscosity of the composition. Preferably, the amount of solvent is about 1 to about 68 wt. % of the composition. The solvent may dissolve the organic binder and may help regulate the viscosity of the prepared composition, thereby providing a paste with good application characteristics.

The solvent may include solvents having a boiling point of about 120° C. or higher. The solvent preferably includes one or more of methyl cellosolve, ethyl cellosolve, butyl cellosolve, aliphatic alcohol, α-terpineol, β-terpineol, dihydroterpineol, ethyleneglycol, ethyleneglycol monobutylether, butyl cellosolve acetate, Texanol, mineral spirit, organic acid, oleic acid, etc.

In order to improve adhesion of the composition to a substrate, a glass frit as an inorganic binder may be added. The amount of glass frit in the composition may be, e.g., about 1 to about 30 wt. % of the composition. The glass frit may include one or more metallic oxide-based glasses, such as PbO, $Bi_2O_3$, $SiO_2$, $B_2O_3$, $P_2O_5$, ZnO, or $Al_2O_3$.

If the amount of the glass frit in the composition is less than about 1 wt. %, the addition of the glass frit may have little or no effect. If the amount exceeds about 30 wt. %, the amount of the conductive filler may be relatively reduced, such that a desired level of conductivity may not be exhibited by the resultant electrode.

The glass frit preferably has a glass transition temperature (Tg), i.e., softening point, of about 300° C. to about 600° C. The glass frit may exhibit significant shrinkage when the softening point of the glass frit is less than about 300° C., which may cause an increase in edge curls of the fabricated electrode. If the softening point is higher than about 600° C., conductive ingredients in the composition may not be sufficiently sintered during firing, thus increasing resistance of the resultant electrode.

The composition of the present invention may also include one or more additives such as a UV stabilizer, a viscosity stabilizer, a defoaming agent, a dispersant, a leveling agent, an antioxidant, a thermal polymerization inhibitor, etc. Such additives are commercially available and well known to those skilled in the art.

The composition for fabricating an electrode according to the embodiments described above may be used to produce an electrode using a process such as a dry film resist (DFR) technique, screen printing, offset printing, photolithography, etc. When using photolithography to fabricate an electrode, the composition according to embodiments may include a photo-polymerizable compound and a photo-initiator.

The photo-polymerizable compound may include a multi-functional monomer or oligomer typically used in photosensitive resin compositions, e.g., ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol hexaacrylate, bisphenol A diacrylate, trimethylolpropane triacrylate, novolac epoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, etc.

The amount of the photo-polymerizable compound preferably is about 1 to about 20 wt. % of the composition. If the amount is less than about 1 wt. %, photo-curing may not be sufficient, which may result in pattern removal during development. If the amount exceeds about 20 wt. %, an amount of the multi-functional monomer or oligomer may be too large, which may impede degradation of organic ingredients during firing and result in an increase in resistance of the resultant electrode.

The photo-initiator preferably exhibits photo-reactivity at a wavelength in a range of about 200 nm to about 400 nm. The photo-initiator may include one or more of, e.g., benzophenone compounds, acetophenone compounds, and triazine compounds. The photo-initiator may be included in the composition in an amount of about 0.01 to about 10 wt. % of the composition.

In using the composition according to embodiments, the composition may first be applied to a substrate and patterned, e.g., using the processes described above. The composition may then be subjected to a drying process, e.g., at room temperature, followed by a baking process at about 100° C. to about 200° C. so as to form a specific electrode pattern with good strength.

Next, the patterned and baked composition may be fired, e.g., at a temperature of about 450° C. to about 600° C., which may remove the entirety of the organic binder and any solvent contained in the patterned composition film, and may allow the glass frit to bind the conductive filler while being fused. In an implementation, the firing process may be repeated, e.g., two or three times, depending on the preparation processes used, dielectric materials, etc.

FIG. 1 illustrates an exploded perspective view of a plasma display panel 10 fabricated using a composition according to an embodiment.

Referring to FIG. 1, the plasma display panel 10 may include a front substrate 100 and a rear substrate 150. The front substrate 100 and the rear substrate 150 may be opposite each other. The front substrate 100 may include transparent electrodes 110 aligned in transverse directions and bus electrodes 112 arranged on the transparent electrodes, e.g., on a surface of the front substrate 100 facing the rear substrate 150. Each of the transparent electrodes 100 may have a corresponding first dielectric layer 114 to store electric charge generated in the panel, and a MgO layer 118 to protect the first dielectric layer 114 and to easily emit electrons.

The rear substrate 150 may include address electrodes 117, e.g., aligned in longitudinal directions on a surface of the rear substrate 150 facing the front substrate 110, a second dielectric layer 115 on the address electrodes 117 above the rear substrate 150, and partitioning walls 120 containing red, green, and blue (RGB) fluorescent materials 132, e.g., phosphors, on the second dielectric layer 115, so as to define specific pixel domains.

An inert gas, e.g., a mixture of Ne and Ar, Ne and Xe, etc., may be introduced into a space between the front substrate 110 and the rear substrate 150. The inert gas may provide a medium for the plasma that results in light generation when a voltage of at least critical voltage is applied to the electrodes.

In the PDP structure described above, the bus electrode 112 and/or the address electrode 117 may be fabricated using the composition according to an embodiment. The electrodes may be formed using, e.g., a dry film resist, screen printing, offset printing, or photolithography.

As a representative example, a process of fabricating an electrode using photolithography may include: (a) applying the composition according to an embodiment to a glass substrate at a thickness of about 5 μm to about 40 μm; (b) drying the composition applied to the substrate at about 80° C. to about 150° C. for about 20 minutes to about 60 minutes; (c) exposing the dried composition film to UV radiation using a photomask; (d) developing the composition film to remove the exposed region, or otherwise, the other region not exposed to UV radiation; and (e) drying and firing the remaining composition film at about 500° C. to about 600° C. In an implementation, the maximum firing temperature may be about 600° C.

The following Examples and Comparative Examples are provided in order to set forth particular details of one or more embodiments. However, it will be understood that the embodiments are not limited to the particular details described.

1. Preparation of Aluminum Flake for Conductive Filler

Preparation Example 1

20 g of aluminum powder having an average particle diameter of about 5 μm (aluminum atomized powder, Product Number: ALE11PB, available from Research Institute of High Purity Chemistry (Osaka, Japan)) was introduced into a cylindrical ceramic container having an inner diameter of 20 cm and a height of 15 cm. 70 g of mineral spirits as a dispersing medium, 3 g of oleic acid as a lubricant, and 740 g of spherical ceramic milling medium having a diameter of 2.3 mm were added to the ceramic container. The aluminum powder was then processed by conducting a ball mill process to prepare aluminum flakes.

The processing time of the ball mill process was adjusted to 3 hours, 6 hours, and 12 hours, so as to obtain aluminum flakes with average thicknesses of 1 μm (hereinafter, powder A), 0.8 μm (hereinafter, powder B), and 0.49 μm (hereinafter, powder C), respectively.

Preparation Example 2

Aluminum alloy flakes were prepared by the same procedure described in Preparation Example 1, except that aluminum alloy powder (8 wt. % silver content) having an average particle diameter of about 5 μm (Ag-8, available from Nano Leader) was used.

The ball mill processing time was 12 hours. The aluminum alloy flakes obtained from the ball milling process had an average thickness of 0.6 μm (hereinafter, powder D).

2. Preparation of Composition for Fabrication of Electrode

Experimental Example 1

46.67 wt. % of powder C as a conductive filler, 11.43 wt. % of a lead-free glass frit having a softening point (Tg) of 480° C. and an average particle diameter of 1.5 μm (LF6002, available from Particlogy Co., Ltd.), 21.9 wt. % of acrylic copolymer as an organic binder (SPN #30-1, available from Geo Myung Co., Ltd.), and 20 wt. % of a solvent were mixed together under stirring, followed by a mixing dispersion using a ceramic 3-roll mill, thus producing a resultant composition.

Experimental Example 2

A composition was prepared by the same procedure described in Experimental Example 1, except that powder D was used as the conductive filler.

Experimental Example 3

57.8 wt. % of powder C as a conductive filler, 37.4 wt. % of an organic binder (Methyl methacrylate/Methacrylic acid copolymer, GEOMYUNG (KOREA), Product Number: SPN #30-1), and 4.8 wt. % of a solvent were mixed together under stirring, followed by mixing dispersion using a ceramic 3-roll mill, thus producing a resultant composition.

The prepared composition was applied, using a coater, to a face of a dielectric layer, which had been formed by applying a dielectric material to a substrate and drying the same. After firing the coated substrate on a belt firing furnace at 560° C., resistance of the fired substrate was measured.

Experimental Example 4

A composition was prepared by the same procedure described in Experimental Example 1, except that 46.67 wt. % of powder C as a conductive filler, 1.5 wt. % of a photoinitiator (IC 369, available from Ciba), 10 wt. % of a photosensitive monomer (SR 494, available from Sartomer Co.), and 8.5 wt. % of a solvent were used.

Comparative Example 1

A composition was prepared by the same procedure described in Experimental Example 1, except that spherical aluminum powder having an average particle diameter of 5 μm (aluminum atomized powder (hereinafter, powder E), available from Research Institute of High Purity Chemistry) was used as a conductive filler.

Comparative Example 2

A composition was prepared by the same procedure described in Experimental Example 1, except that powder A was used a conductive filler.

Comparative Example 3

A composition was prepared by the same procedure described in Experimental Example 1, except that powder B was used a conductive filler.

Comparative Example 4

A composition was prepared by the same procedure described in Experimental Example 1, except that 46.67 wt. % of powder A as a conductive filler, 1.5 wt. % of a photoinitiator (IC 369, available from Ciba), 10 wt. % of a photosensitive monomer (SR 494, available from Sartomer Co.), and 8.5 wt. % of a solvent were used.

3. Formation of Electrode Pattern Using Composition and Determination of Physical Properties 3-1 Formation of Electrode Pattern Using a Coater Each of the compositions prepared in Experimental Examples 1 and 2, as well as Comparative Examples 1 to 3, was applied to a glass plate having a high melting point with dimensions of 10 cm×10 cm using a PI 1210 coater (manufactured by TESTER Sangyo Co., Ltd.). The coated plate was dried at room temperature and subjected to a baking process at 110° C., followed by a firing process using a belt furnace at 560° C. for 15 minutes at peak and in-out time of one and a half hours, resulting in formation of a pattern having a thickness of 25 μm.

The resistances of the resultant test electrodes were then measured. The results are shown in Table 1 in FIG. 2.

3-2 Formation of Electrode Pattern Through Photolithography

Using each of the compositions prepared in Experimental Example 4 and Comparative Example 4, an electrode was fabricated by: (a) applying the composition to a substrate at a thickness of 25 μm; (b) drying the composition applied to the substrate at 110° C. for about 20 minutes; (c) exposing the dried composition film to UV radiation using a photomask; (d) developing the composition film; and (e) drying and firing the remaining composition film at 560° C.

The resistances of the resultant test electrodes were then measured. The results are shown in Table 1.

4. Measurement of Variation in Resistances Depending on Re-Firing of Electrode

After measuring an initial resistance of a patterned electrode fabricated using each of the compositions prepared in Example 1 and Comparative Example 1 according to the coating processes described above, respectively, the electrode was further subjected to repeated firing, i.e., once or twice repeated. The variation in resistance of the fired electrode was then determined. The results are shown in Table 2 in FIG. 3.

Referring to Table 1, it is apparent that aluminum or aluminum alloy in a flake shape used as a conductive filler provides significantly lower resistance as compared to the conductive filler having a spherical powder form. These effects were relatively noticeable for powder C, which had a thickness less than those of the other flake-type fillers.

Referring to Table 2, it is apparent that an electrode fabricated using a composition that includes aluminum in a flake shape for the conductive filler, as prepared in Experimental Example 1, showed very little variation in resistance upon being re-fired. In contrast, an electrode fabricated using a composition that included a spherical powder for the conductive filler, as prepared in Comparative Example 1, exhibited an increase in resistance of at least 10% upon being re-fired.

The above-described Examples demonstrate that the composition for fabricating an electrode according to embodiments may be useful for fabrication of an electrode that can be fired at a temperature of about 600° C. or less while exhibiting little or no variation in resistance, even when a firing process is repeatedly carried out, thereby providing an electrode with excellent conductivity.

Further, embodiments may provide a composition and an electrode fabricated using the same, e.g., using a dry film resist (DFR) technique, screen printing, offset printing, photolithography, etc. The dry film resist may include the composition according to an embodiment disposed between a support film and a cover sheet. The cover sheet may serve to protect the dry film resist during storage. The support film may transmit light or energy of a wavelength suitable to initiate reactions, e.g., polymerization, in the dry film resist. The dry film resist (DFR) technique is a process which forms and patterns an electrode film by coating and drying a photosensitive or non-photosensitive electrode composition on a substrate, laminating the photosensitive (i.e., photolithographic) dry film on the electrode film and making the desired electrode pattern thorough a UV exposure and development process.

Using the composition for fabricating an electrode, the firing may be conducted at a temperature of about 600° C. or less, e.g., about 450° C. to about 600° C., sufficient to use the composition in manufacturing plasma display panels. Also, even when the firing process is repeatedly carried out, a resultant electrode may exhibit little or no variation in resistance.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A composition for fabricating an electrode, the composition comprising:

an organic binder;

a glass frit; and a conductive filler, wherein:

about 3 to about 60 wt. % of the composition is the organic binder, about 1 to about 30 wt. % of the composition is the glass frit, about 5 to about 95 wt. % of the composition is the conductive filler, the conductive filler includes predominantly aluminum, the conductive filler has a flake shape, and the conductive filler has an average thickness of about 0.05 μm to about 0.75 μm.

2. The composition as claimed in claim 1, further comprising a solvent.

3. The composition as claimed in claim 2, wherein about 1 to about 68 wt. % of the composition is the solvent.

4. The composition as claimed in claim 1, wherein the conductive filler is prepared by processing a conductive powder to transform the powder to flakes.

5. The composition as claimed in claim 1, wherein the conductive filler includes an alloy of aluminum with one or more of silver, copper, silicon, tin, chromium, or germanium.

6. The composition as claimed in claim 1, wherein the organic binder includes at least one copolymer of a first monomer and a second monomer, the first monomer is a carboxyl group-containing monomer, and the second monomer is an alkene-containing monomer.

7. The composition as claimed in claim 6, wherein:

the carboxyl-group containing monomer is a substituted or unsubstituted one of acrylic acid, methacrylic acid, or itaconic acid, and the alkene-containing monomer is a substituted or unsubstituted one of acrylic acid ester, styrene, acrylamide, or acrylonitrile.

8. The composition as claimed in claim 1, wherein the glass frit has a glass transition temperature of about 300° C. to about 600° C.

9. The composition as claimed in claim 1, further comprising a photo-initiator, wherein about 0.01 to about 10 wt. % of the composition is the photo-initiator.

10. A method of preparing a composition for fabricating an electrode, the method comprising:

providing an organic binder;

providing a glass frit; and combining the organic binder and a conductive filler, wherein:

about 3 to about 60 wt. % of the composition is the organic binder, about 1 to about 30 wt. % of the composition is the glass frit, about 5 to about 95 wt. % of the composition is the conductive filler, the conductive filler includes predominantly aluminum, the conductive filler has a flake shape, and the conductive filler has an average thickness of about 0.05 μm to about 0.75 μm.

11. The method as claimed in claim 10, wherein the conductive filler is prepared by processing a conductive powder to transform the powder to flakes.

12. The method as claimed in claim 10, further comprising:

providing a conductive powder, and processing the conductive powder using a mill so as to transform the powder to flakes.

13. A method of fabricating an electrode, the method comprising:

providing a composition that includes an organic binder, a glass frit, and a conductive filler; and forming the composition into an electrode pattern, wherein:

about 3 to about 60 wt. % of the composition is the organic binder, about 1 to about 30 wt. % of the composition is the glass frit, about 5 to about 95 wt. % of the composition is the conductive filler, the conductive filler includes predominantly aluminum, the conductive filler has a flake shape, and the conductive filler has an average thickness of about 0.05 μm to about 0.75 μm.

14. The method as claimed in claim 13, wherein:

forming the composition into an electrode pattern includes application of the composition to a substrate, and the application of the composition to the substrate includes one or more of a dry film resist technique, coating, screen printing, offset printing, or photolithography.

15. The method as claimed in claim 13, further comprising, after forming the composition into an electrode pattern, firing the electrode pattern at a temperature of about 450° C. to about 600° C.

16. An electrode fabricated using the method as claimed in claim 13.

17. A plasma display panel, comprising:

a front substrate and a rear substrate arranged opposite each other;

transparent electrodes aligned in a first direction on the front substrate;

bus electrodes on the transparent electrodes; and address electrodes aligned in a second direction on the rear substrate, wherein the bus electrodes and/or the address electrodes are fabricated using the method as claimed in claim 13.

* * * * *